United States Patent [19]
Turner

[11] Patent Number: 5,218,315
[45] Date of Patent: Jun. 8, 1993

[54] SWITCHING AMPLIFIER

[75] Inventor: Wheeler M. Turner, Santa Barbara, Calif.

[73] Assignee: Infinity Systems, Inc., Chatsworth, Calif.

[21] Appl. No.: 817,862

[22] Filed: Jan. 6, 1992

[51] Int. Cl.$^5$ .............................................. H03F 3/38
[52] U.S. Cl. .................................. 330/10; 330/207 A
[58] Field of Search ...................... 330/10, 207 A, 251; 381/120, 121

[56] References Cited

U.S. PATENT DOCUMENTS 4,415,863  11/1983  Tokumo ........................... 330/10

Primary Examiner—Steven Mottola
Attorney, Agent, or Firm—Jones, Day, Reavis & Pogue

[57] ABSTRACT

An improved digital switching amplifier is disclosed. The amplifier utilizes a low-pass filter at the input of the switching comparator to give an improved signal to noise ratio at the final output. In another aspect of the invention, a propagation delay is used to produce the steady-state oscillation of the amplifier circuit.

13 Claims, 7 Drawing Sheets

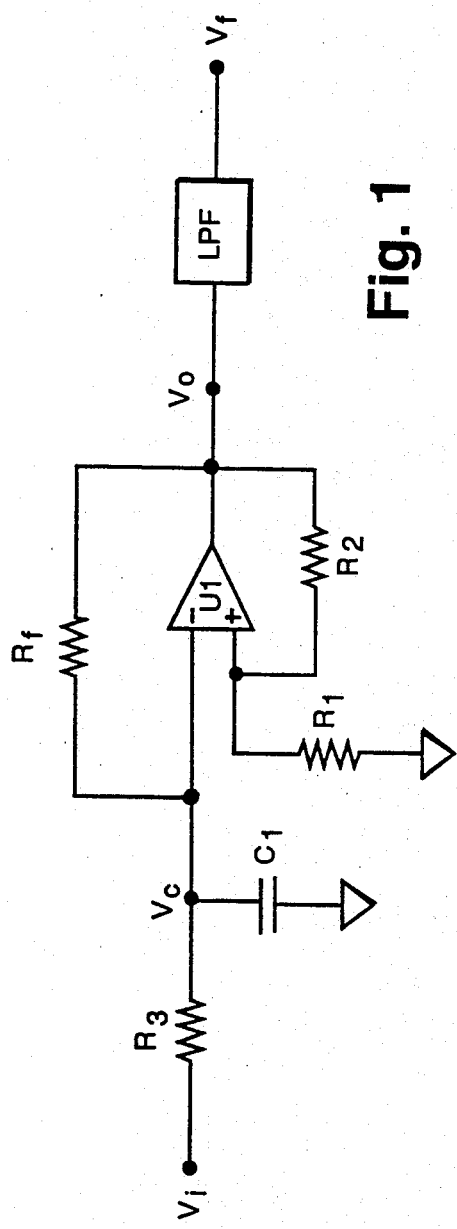
Fig. 1
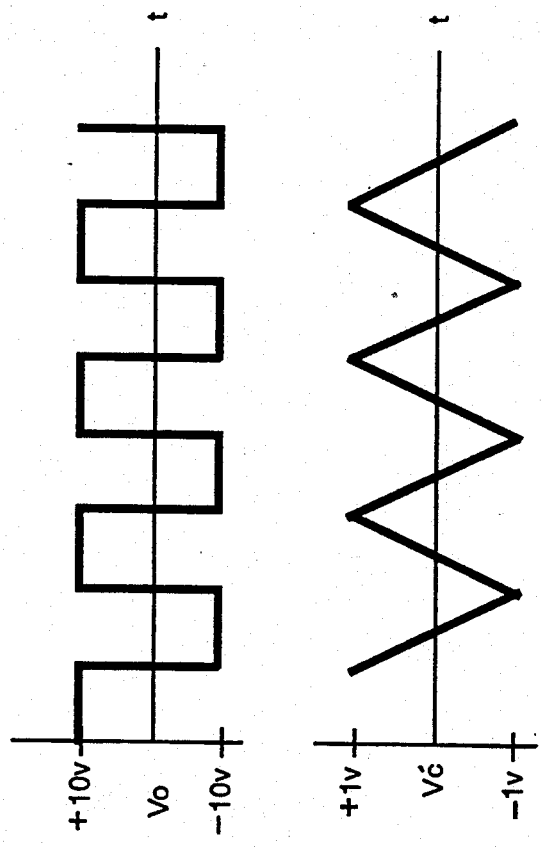
Fig. 2a
Fig. 2b

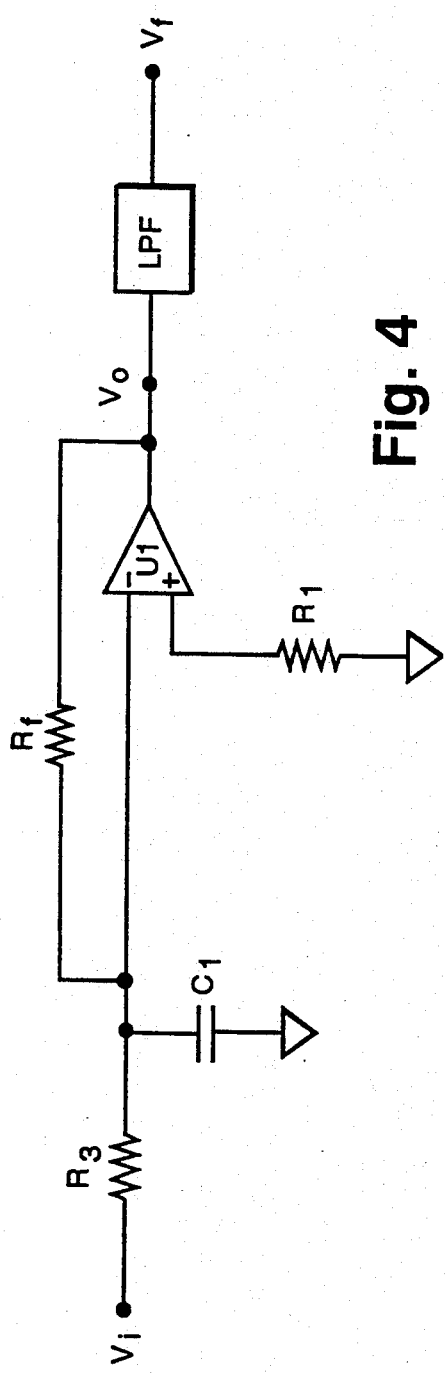
Fig. 4
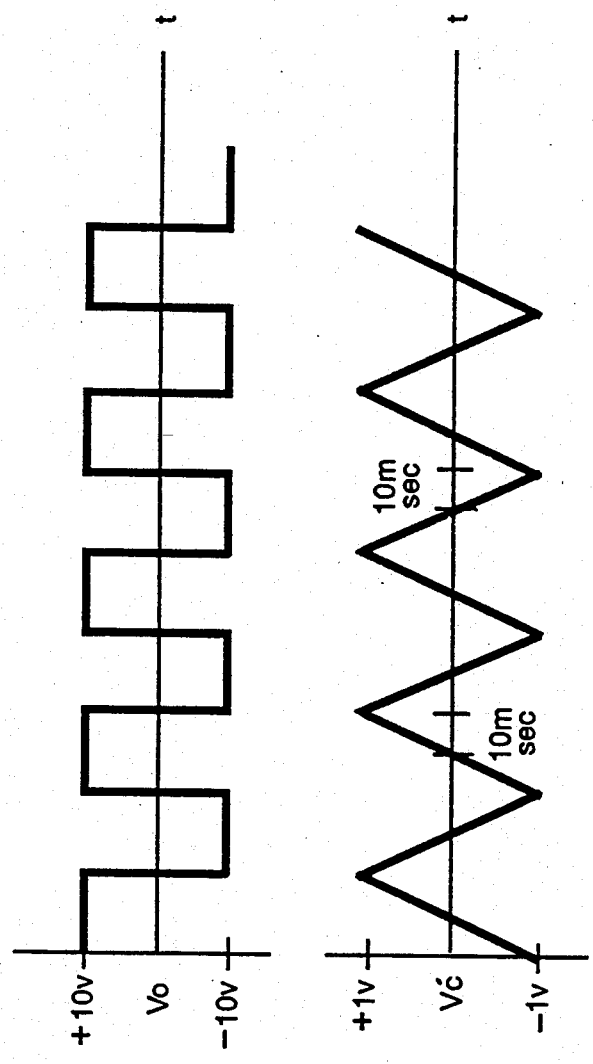
Fig. 5a
Fig. 5b

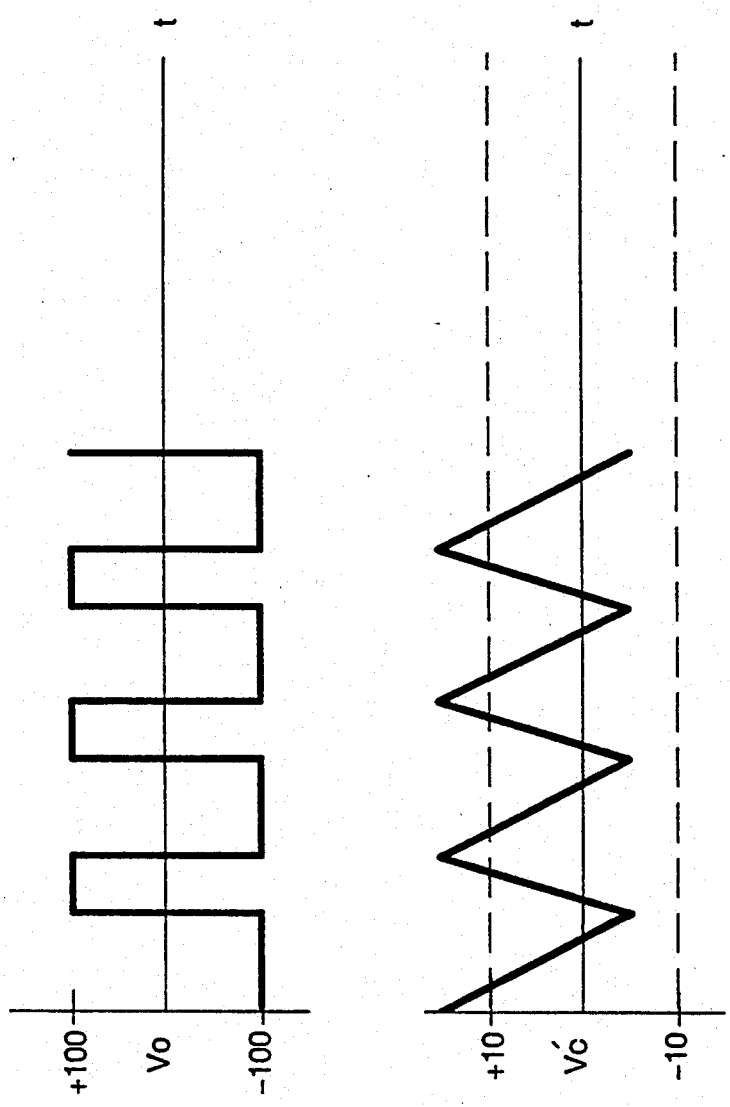

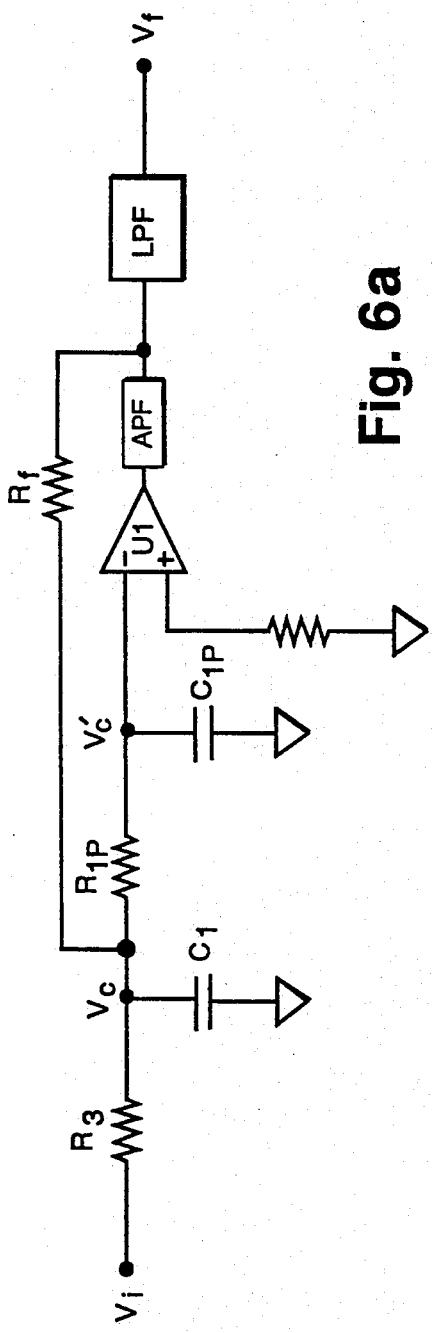
Fig. 6a
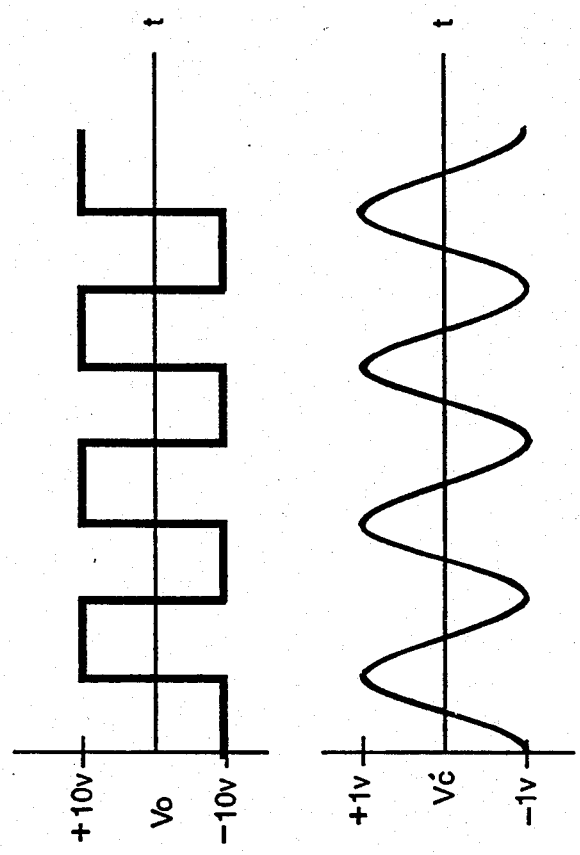
Fig. 7a
Fig. 7b

SWITCHING AMPLIFIER

BACKGROUND

It is well-known that signal processing systems using digital or two-state signals (i.e. those that have only two amplitude levels) have numerous advantages over systems using continuous signals. Two-state signals are less sensitive to variations in the operating characteristics of the electronic devices making up the system because all that is important is the discrimination between the two amplitude levels. It is therefore also not necessary that the devices operate linearly. Also, since the active circuit elements can be operated in a switching mode, which consumes less power than a continuous mode, digital systems are inherently more efficient than purely analog systems.

One common signal processing application to which digital techniques have been applied is that of amplification. Audio power amplifiers for automobile sound systems, where efficiency is a very important consideration, are particularly suitable for the application of digital techniques.

Shown in FIG. 1 is a basic schematic of a type of two-state or switching amplifier well known to the art. (In all the following descriptions, each designation of electrical components such as resistors or capacitors will be taken to refer both to the component and to its value.) The inverting input terminal of comparator U1 is connected to ground through capacitor $C_1$, and to the U1 output terminal via negative feedback resistor $R_f$. The voltage applied to the inverting terminal is designated $V_c$ and to the noninverting terminal $V_p$. The noninverting input terminal is connect to ground via resistor $R_1$ and to the U1 output terminal by resistor $R_2$. An input signal $V_i$ is applied to the inverting input of U1, a signal $V_o$ appears at the U1 output. $R_3$ is made very large so as to isolate the amplifier input from the input signal source. The operation of the amplifier is as follows. Assume that U1 is connected to a power supply such that its output swings between $-10$ and $+10$ volts, depending upon whether the voltage difference between its noninverting and inverting terminals is negative or positive, respectively. We will first assume that resistor $R_3$ is grounded so that no input signal $V_i$ is applied to the amplifier. Assume further that we are at a point in time where the output voltage $V_o$ is at $+10$ volts. At this point, capacitor $C_1$ is being charged through negative feedback resistor $R_f$ toward the positive output voltage. The charging of capacitor $C_1$ takes place with a time constant approximately equal to $R_fC_1$ since $R_3$ is made very large. Now assume that $R_1$ and $R_2$ equal 1K and 9K, respectively, so that the voltage present at the noninverting U1 input is 1 volt. This means that as soon as capacitor $C_1$ is charged to 1 volt, the comparator switches states which causes the output voltage to go to $-10$ volts. At this point, capacitor $C_1$ begins to discharge from its $+1$ volt level toward the negative output voltage through resistor $R_f$. The noninverting input terminal voltage $V_p$ immediately goes to $-1$ volt. The output $V_o$ then remains at $-10$ v until capacitor $C_1$ has discharged to approximately $-1$ volts, at which point comparator U1 again switches state causing $V_o$ to go to $+10$ v. The cycle then repeats as before.

The amplitudes of the voltages $V_o$ and $V_c$ are both shown plotted against time t in FIGS. 2a and 2b. $V_o$ is seen to be a square wave form oscillating between $+10$ and $-10$ volts. $V_c$, on the other hand, is a triangular waveform oscillating between $+1$ and $-1$ volts which represents the charging and discharging of capacitor $C_1$. (It is assumed that the frequency at which $C_1$ charges and discharges is high enough to be essentially linear.) What has been described, therefore, is a square wave oscillator. The edge transitions of $V_o$ coincide with the positive and negative peaks of $V_c$. It should be apparent that the time between edge transitions of $V_o$ depends upon how long capacitor $C_1$ takes to charge to its negative or positive peak value. That, of course, depends upon the RC time constant (i.e., on the value of $R_fC_1$) and on the magnitude of the peak charging voltages. The latter depends upon the value of $R_2$ since it, combined with $R_1$, forms a voltage divider to feed back a portion of the output to the noninverting input of U1 where it is compared by U1 to the voltage of its inverting input. If $R_2$ is made larger with respect to $R_1$, less voltage is fed back which means that $V_c$ will make smaller voltage swings in causing comparator U1 to change state. If the time constant $R_fC_1$ is unchanged, the frequency of both $V_c$ and $V_o$ will therefore be increased as $R_2$ is made larger. In an extreme case where $R_2$ is made infinite, (i.e., an open circuit) the oscillator frequency becomes theoretically infinite since capacitor $C_1$ never has a chance to charge or discharge before comparator U1 changes state. Resistor $R_2$ thus enables a workable oscillator by providing a kind of hysteresis to the circuit so that capacitor $C_1$ is given some time in which to charge or discharge.

Now assume that a positive D.C. voltage $V_i$ is applied through resistor $R_3$ to capacitor $C_1$. Capacitor $C_1$ presents an open circuit to a D.C. signal so the circuit operates as a conventional operational amplifier. Therefore, $V_i$ is inverted and amplified by the ratio of $R_f$ to $R_3$ and appears as a negative D.C. signal in the output $V_o$. However, since neither the amplitude nor the fundamental frequency of $V_o$ can change due to the inherent characteristics of the circuit, the only way the negative D.C. component can manifest itself at the output is for the width of the positive pulses to decrease while that of the negative pulses increases. The result is a waveform with the same fundamental frequency but with a negative D.C component equal to $V_i$ multiplied by the ratio of $R_f$ to $R_i$. The additional D.C component of $V_o$ also changes $V_c$ since capacitor $C_1$ will take a little more time to charge and a little less time to discharge. The positive D.C. signal $V_i$ charges capacitor $C_1$ positively which adds to the cyclical charging and discharging of $C_1$ as described above in a manner which increases the discharging time and decreases the charging time. FIG. 3b shows the resulting $V_c$ waveform where the slopes of the waveform's positive going excursions are steeper while the negative going excursions are flattened as compared with the $V_c$ waveform in FIG. 2a. FIG. 3a shows the corresponding $V_o$ waveform where the positive pulses are narrowed while the time between positive pulses is increased. The fundamental frequency of $V_o$ is unchanged though, because however much the charging time of capacitor $C_1$ is decreased, the discharging time is increased by the same amount.

Exactly the same situation as described above occurs if the signal $V_i$ is a negative D.C. voltage with the positive pulses of $V_o$ being widened instead of narrowed. The circuit operates similarly with a continuously varying $V_i$ signal as long as the highest frequency component of $V_i$ is small as compared to the fundamental oscillator frequency of $V_o$. The result is that the $V_o$ waveform is pulse-width modulated by an amplified $V_i$ signal. The $V_i$ signal can be recovered by passing $V_o$ through an appropriate low pass filter LPF to give the amplified output signal $V_f$.

What has been described above is sometimes called a hysteretic switching amplifier, referring to the hysteresis provided by the positive feedback resistor $R_3$. The aforementioned advantages of insensitivity to component characteristics and high efficiency are obtained with such an amplifier. One problem which is inherent to the amplifier circuitry, however, is the uncertainty existing as to exactly when the comparator U1 changes state. That is, when $V_c$ equals $V_p$. Comparator U1 is then in an indefinite state and one cannot exactly predict when it will respond and switch states. This uncertainty manifests itself as noise in the output of the amplifier after $V_o$ is passed through a low pass filter.

SUMMARY OF THE INVENTION

The present invention is a switching amplifier designed in a manner which reduces the uncertainty in switching time of the amplifier. The result is an improved signal to noise ratio at the final output. In accordance with the present invention, the inherent oscillation of the amplifier can occur due to a constant time delay existing in the forward signal path through the amplifier's comparator rather than by the use hysteretic positive feedback resistor. Also in accordance with the invention, the signal fed to the comparator's inverting input is passed through a low pass filter which operates so as to convert the triangular waveform to a more sinusoidal one. The result is a waveform which passes through the point at which the comparator switches state at a more rapid rate.

BRIEF DESCRIPTION OF THE DRAWINGS

FIG. 1 is a basic schematic of a conventional hysteretic switching amplifier.

FIGS. 2a and 2b depict the $V_o$ and $V_c$ waveforms for the amplifier in FIG. 1 when no $V_i$ voltage is applied.

FIG. 4 is a basic schematic of a switching amplifier with no positive feedback to add hysteresis.

FIGS. 5a and 5b show the $V_o$ and $V_c$ waveforms for the amplifier in FIG. 4 when no $V_i$ voltage is applied.

FIGS. 5c and 5d show the $V_o$ and $V_c$ waveforms for the amplifier in FIG. 4 when $V_i$ is a positive D.C. voltage.

FIG. 6a is a switching amplifier with an added low pass filter for noise reduction.

FIGS. 7a and 7b show the $V_o$ and $V_c$ waveforms for the amplifier of FIG. 6 with no $V_i$ voltage applied.

DETAILED DESCRIPTION OF THE INVENTION

Figure 3A:
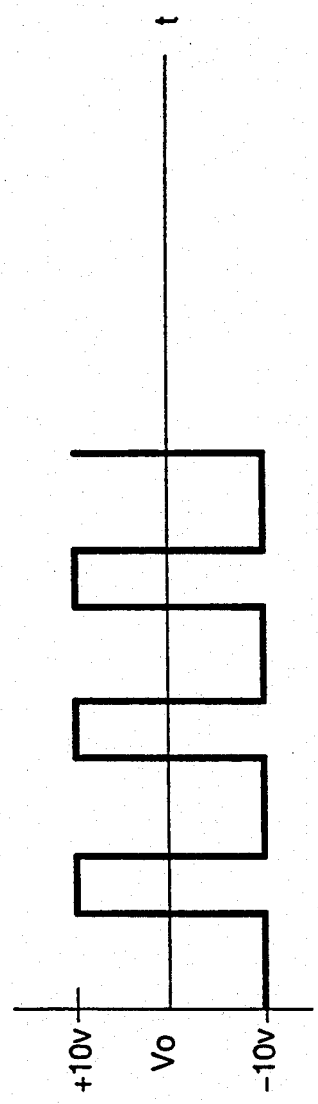
FIGS. 3a and 3b depict the $V_o$ and $V_c$ waveforms for the amplifier in FIG. 1 when $V_i$ is a positive D.C. voltage.
Figure 3B:
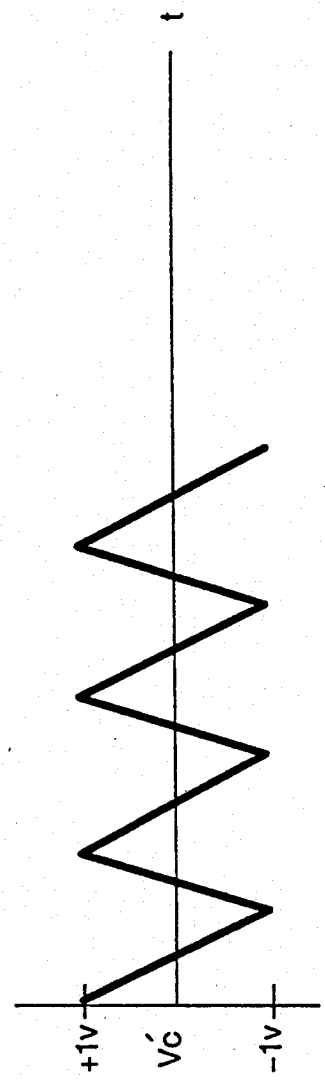

FIG. 4 shows a basic schematic of a switching amplifier with no positive feedback resistor $R_p$. As discussed above, if the comparator is assumed to change states instantaneously in response to a difference in its inverting and noninverting inputs, the amplifier would oscillate at a theoretically infinite frequency. What this effect actually translates into is a stable, high gain amplifier. Real world devices, however, necessarily exhibit some propagation delays, the effect of which is to destabilize the amplifier of FIG. 4 and cause it to oscillate. This is an undesirable result, of course, if one is trying to build an analog amplifier. Where oscillation is desirable, however, such as in a switching amplifier, advantage can be taken of such propagation delays to cause stable oscillation at a frequency dependent on the amount of the delay. Referring back to FIG. 4, let us assume that comparator U1 again is biased such that the output voltage $V_o$ swings between $-10$ and $+10$ volts depending upon the polarity of the difference between its inverting and noninverting inputs. Assume also that comparator U1 has an inherent delay time of 10 usec in responding to a change in its input before it changes state. FIGS. 5a and 5b show the $V_o$ and $V_c$ waveforms that result if the values of $C_1$ and $R_f$ are assumed to be such that capacitor $C_1$ will go from 0 volts to $+1$ volt in 10 usec when 10 volts are applied at $V_o$. Thus, if the amplifier is initially in a state where $V_o = 10+$ volts, capacitor $C_1$ will begin charging up toward the positive voltage. When $V_c$ reaches 0 volts, it then equals the grounded reference voltage $V_p$ which causes the comparator U1 to begin to change state and swing the output voltage $V_o$ from $+10$ volts to $-10$ volts. Because of the propagation delay, however, the change in $V_o$ does not occur until 10 $\mu$sec later which allows $V_c$ to reach $+1$ volt. At that point, $V_o$ goes to $-10$ volts, and capacitor $C_1$ begins discharging toward the negative voltage. When $V_c$ reaches 0 volts, comparator U1 again begins to change state, but, as before, the propagation delay prevents the output from changing until 10 $\mu$sec have elapsed which allows $V_c$ to go to $-1$ volt. Thus, the amplifier produces $V_o$ and $V_c$ waveforms exactly like the waveforms produced by the hysteretic amplifier of FIG. 1 but by utilizing a propagation delay instead of a positive feedback resistor. FIGS. 5c and 5d show the $V_o$ and $V_c$ waveforms, respectively, for the amplifier in FIG. 4 where a positive D.C. voltage $V_c$ is applied through resistor $R_3$ to capacitor $C_1$. $V_c$ is seen to be similar to the $V_c$ waveform in FIG. 3b with steeper positive going excursions and flatter negative going excursions. Because the capacitor always charges for 10 $\mu$sec in this example after the $V_c$ waveform crosses zero, however, the $V_c$ waveform here is shifted vertically upward by some amount as compared with FIG. 3b. A sufficient propagation delay to give a desired oscillation frequency can be produced with a comparator having an inherent delay in its response time, additional amplifiers in the signal path, an all-pass filter network in the signal path, or any combination thereof. The operation of the amplifier is in most other respects the same as the FIG. 1 amplifier so that it produces a waveform $V_o$ pulse width modulated by an input signal $V_i$. An amplified version of $V_i$ is then recovered by passing $V_o$ through low pass filter LPF.

It should be appreciated from looking at FIGS. 5a and 5b that comparator U1 is in an ambiguous state when $V_c$ reaches 0 volts. The exact point at which the comparator U1 begins to change state cannot be predicted with certainty. This causes random variations in the widths of the $V_o$ pulses which translates to noise at the final output $V_f$. The uncertainty, and hence the noise, can be reduced if $V_c$ can be made to pass through the zone of uncertainty (i.e., 0 volts) at a faster rate. One way to accomplish this is by passing $V_c$ through a low pass filter before it reaches the comparator U1. When a triangular waveform, such as $V_c$, is passed through a low pass filter, the result approximates a sine wave which crosses zero volts at a rate approximately 1.6 times as fast as the triangular wave.

Figure 6B:
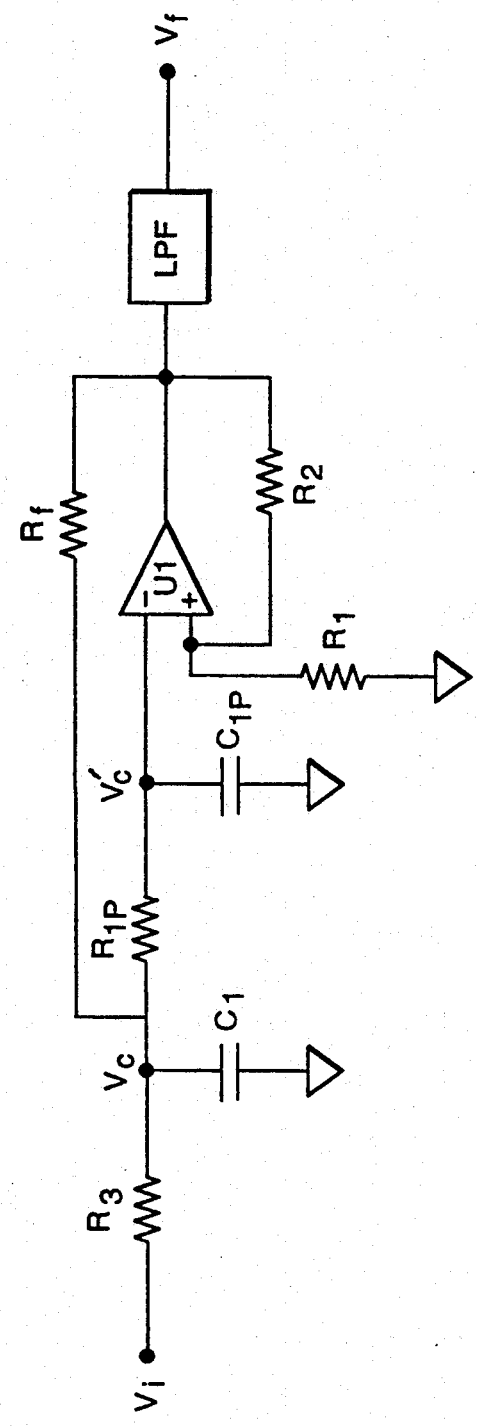
FIG. 6b is a hysteretic switching amplifier with an added low pass filter for noise reduction.

FIG. 6a shows a basic switching amplifier circuit which is the same as that in FIG. 4 (including a 10 μsec propagation delay provided by all-pass filter APF) except for the addition of $R_{1p}$ and $C_{1p}$ which form a low pass filter. The resulting $V_o$ and $V_c$ waveforms (where $V'_c$ is the voltage across $C_{1p}$) are shown in FIGS. 7a and 7b. It is seen now that, because of $R_{1p}$ and $C_{1p}$, the voltage fed to the comparator's inverting input $V'_c$ is no longer triangular but is instead a sinusoid. The more rapid zero crossings of $V'_c$ in this circuit translate into less uncertainty as to when comparator U1 changes state and, therefore, an improved signal to noise ratio in the final output $V_f$. It should be appreciated that the low pass filter comprising $R_{LP}$ and $C_{LP}$ can also be employed in a hysteretic switching amplifier to reduce noise FIG. 6b shows such an amplifier. In that case, the more sinusoidal $V'_c$ waveform passes through the point at which $V'_c = V_p$ more rapidly.

Figure 8:
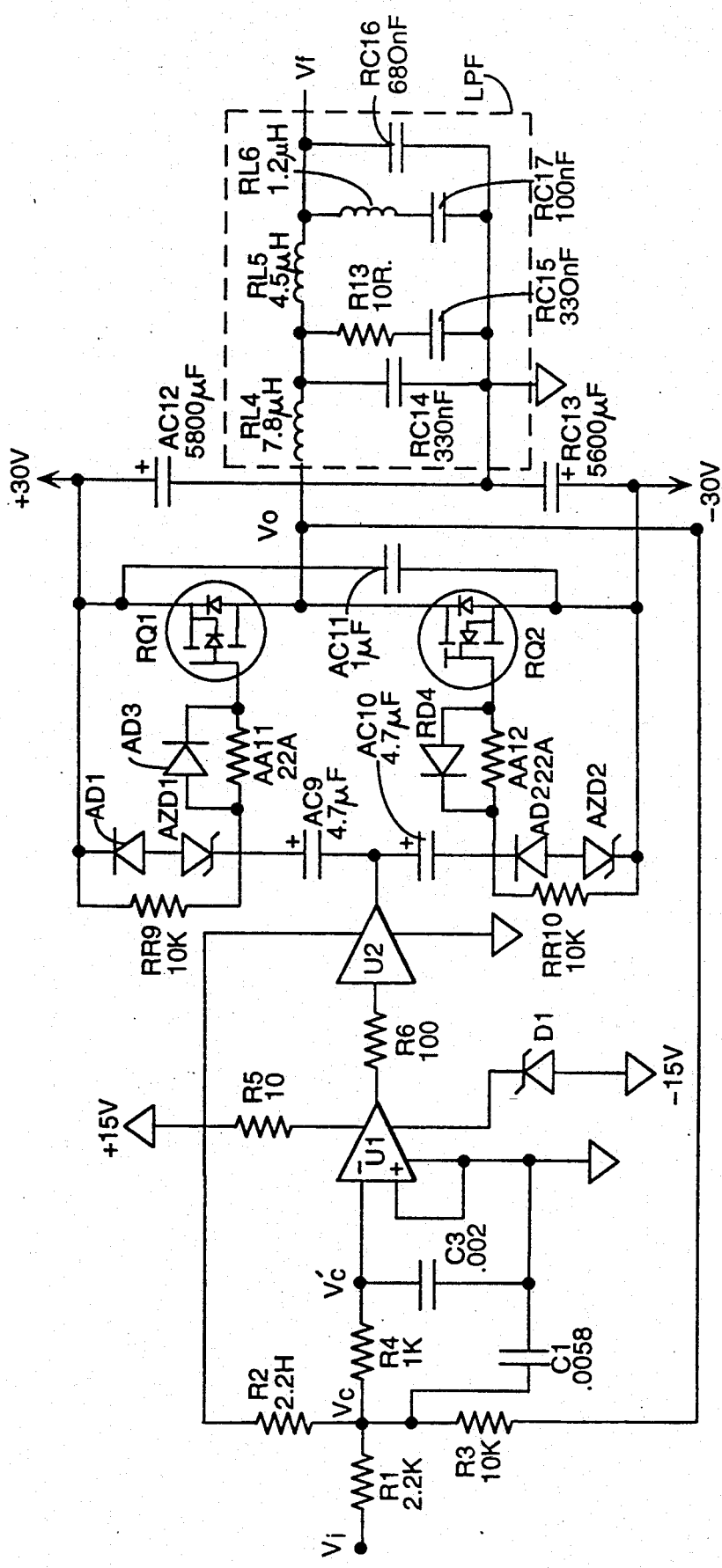
FIG. 8 is a schematic of an exemplary embodiment of the invention for an audio amplifier application.

FIG. 8 shows an exemplary embodiment of the present invention for an audio amplifier application. Nominal values for the components are given under the component designator. After passing through appropriate linear amplification and signal conditioning circuitry (which is well-known and will therefore not be discussed here), an audio frequency signal $V_i$ is fed to the inverting input of comparator U1 through resistors $R_1$ and $R_4$. The noninverting input of U1 is connected to ground. Comparator U1 has terminals connected to a +15 supply voltage via resistor $R_5$ and to a −15 supply voltage via Zener diode D1. Biasing resistor $R_2$ feeds the +15 supply voltage to the point between $R_1$ and $R_4$, the voltage of which is labeled $V_c$. The $V_c$ voltage point is also connected to ground via capacitor $C_1$. Resistor $R_4$ and capacitor C3 also connect the $V_c$ voltage point to ground and form the low pass filter described earlier (i.e., the same as $R_{1p}$ and $C_{1p}$ in FIG. 6) with the voltage $V'_c$ fed to the inverting input of comparator U1.

The output of comparator U1 is then fed via resistor $R_6$ to inverting buffer amplifier U2 whose output is fed to an inverting output stage comprising high speed switching elements RQ1, RQ2, and associated circuit elements. RQ1 and RQ2 are FET's in a push-pull arrangement which output a voltage $V_o$ at their drains between +30 and −30 volts which is then fed back to the inverting input of comparator U1 via resistor $R_3$. The circuitry is thus similar to the amplifier in FIG. 6 except that the output of comparator U1 is passed through two inverting amplifier stages before being returned as negative feedback. The additional amplifier stages also cause propagation delay which, as explained above, advantage is taken of in accordance with the present invention. In the embodiment described, $V_o$ is a square waveform with a fundamental frequency of approximately 500 KHz, pulse width modulated by the input signal $V_i$. The amplified $V_i$ signal is then reconstituted as $V_f$ when $V_o$ is passed through the low pass filter LPF.

What is claimed is:

1. A pulse-width modulation circuit, comprising:
   a comparator whose output swings between first and second voltage levels in accordance with the polarity of the voltage difference between the comparator's non-inverting and inverting inputs;
   wherein the comparator's inverting input is connected to the comparator output through a feedback resistor, to ground through a capacitor, and to an input signal through an input resistor;
   wherein the comparator's non-inverting input is maintained at a constant potential;
   means for providing a sufficient propagation delay in a path comprising the comparator and feedback resistor so that the capacitor charges for some time after a change in the polarity of the voltage difference between the comparator's inverting and non-inverting inputs, the capacitor voltage being substantially a triangular waveform which thereby causes the comparator output to be a square wave at a frequency determined by the values of the capacitor, feedback resistor, and first and second voltage levels;
   and, wherein an input signal applied to the comparator's inverting input causes the comparator output to be pulse width modulated by the input signal.

2. The modulation circuit as set forth in claim 1 further comprising a low pass filter between the capacitor and the inverting input of the comparator for converting the triangular capacitor voltage waveform into a substantially sinusoidal waveform.

3. The modulation circuit as set forth in claim 2 wherein the low pass filter comprises a resistor and capacitor connected between the comparator inverting input and ground.

4. The modulation circuit as set forth in claim 1 wherein the propagation delay means comprises an all-pass filter network.

5. The modulation circuit as set forth in claim 1 further comprising a first low pass filter at the output of the comparator for recovering the input signal from the pulse width modulated comparator output signal, the circuit thereby becoming a switching amplifier.

6. The circuit as set forth in claim 5 further comprising a second low pass filter between the capacitor and the inverting input of the comparator for converting the triangular capacitor voltage waveform into a substantially sinusoidal waveform in order to improve the signal to noise ratio of the amplifier.

7. The circuit as set forth in claim 5 wherein the propagation delay means comprises an all-pass filter network.

8. The circuit as set forth in claim 5 wherein the propagation delay means comprises an additional amplifier stage between the comparator output and the feedback resistor.

9. A switching amplifier, comprising:
   a comparator with inverting and non-inverting inputs having its output connected to its inverting input through a feedback resistor and its inverting input connected to an input signal through an input resistor;
   a capacitor connecting the inverting input of the comparator to ground;
   a comparator whose output swings between first and second voltage levels in accordance with the polarity of the voltage difference between the comparator's non-inverting and inverting inputs;
   wherein the comparator's inverting input is connected to the comparator output through a feedback resistor, to ground through a capacitor, and to an input signal through an input resistor;
   a first resistor connecting the comparator non-inverting input to ground;

a second resistor connecting the comparator output to the comparator non-inverting input, the first and second resistors thereby forming a voltage divider for feeding back a portion of the comparator's output to its non-inverting input so that after a change in the comparator output the capacitor charges up to the voltage across the first resistor before the comparator output changes, the capacitor voltage thereby being substantially a triangular waveform;

a first low pass filter for recovering the input signal from the comparator output; and a second low pass filter between the capacitor and the inverting input of the comparator for converting the triangular capacitor voltage waveform into a substantially sinusoidal waveform in order to improve the signal to noise ratio of the amplifier.

10. The amplifier as set forth in claim 9 wherein the second low pass filter comprises a resistor and capacitor connecting the inverting input of the comparator to ground.

11. The circuit as set forth in claim 6 wherein the second low pass filter comprises a resistor and capacitor connected between the comparator inverting input and ground.

12. The circuit as set forth in claim 6 wherein the propagation delay means comprises an all-pass filter network.

13. The circuit as set forth in claim 6 wherein the propagation delay means comprises an additional amplifier stage between the comparator output and the feedback resistor.

* * * * *